United States Patent
Su et al.

(10) Patent No.: US 10,636,798 B2
(45) Date of Patent: Apr. 28, 2020

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yu-Shan Su, Taipei (TW); Chia-Wei Wu, Taichung (TW); Ting-Pang Chung, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 16/658,170

(22) Filed: Oct. 21, 2019

(65) Prior Publication Data

US 2020/0051985 A1 Feb. 13, 2020

Related U.S. Application Data

(62) Division of application No. 16/048,335, filed on Jul. 29, 2018, now Pat. No. 10,490,556.

(30) Foreign Application Priority Data

Jul. 2, 2018 (CN) .......................... 2018 1 0706674

(51) Int. Cl.
*H01L 21/762* (2006.01)
*H01L 27/108* (2006.01)
*H01L 29/06* (2006.01)
*H01L 21/02* (2006.01)
*H01L 21/3105* (2006.01)
*H01L 27/11531* (2017.01)

(52) U.S. Cl.
CPC .... *H01L 27/10894* (2013.01); *H01L 21/0217* (2013.01); *H01L 21/0228* (2013.01); *H01L 21/0234* (2013.01); *H01L 21/02164* (2013.01); *H01L 21/31055* (2013.01); *H01L 21/76229* (2013.01); *H01L 27/10897* (2013.01); *H01L 29/0649* (2013.01); *H01L 27/11531* (2013.01)

(58) Field of Classification Search
CPC ..................... H01L 21/76229; H01L 27/11531
See application file for complete search history.

(56) References Cited

U.S. PATENT DOCUMENTS 4,855,804 A * 8/1989 Bergami ............. H01L 21/3145
257/622
4,871,689 A * 10/1989 Bergami ............. H01L 21/3145
438/427

(Continued)

*Primary Examiner* — George R Fourson, III
(74) *Attorney, Agent, or Firm* — Winston Hsu

(57) ABSTRACT

A method for fabricating semiconductor device includes the steps of: providing a substrate having a memory region and a periphery region; forming a first trench and a second trench in substrate on the memory region, wherein a width of the second trench is greater than a width of the first trench; forming a first liner, a second liner, and a third liner in the first trench and the second trench; performing a surface treatment process to lower stress of the third liner; and planarizing the third liner, the second liner, and the first liner to form a first isolation structure and a second isolation structure.

11 Claims, 3 Drawing Sheets

(56) References Cited

U.S. PATENT DOCUMENTS

| | | | |
|---|---|---|---|
| 5,741,740 A * | 4/1998 | Jang | H01L 21/76224 |
| | | | 438/435 |
| 7,229,896 B2 * | 6/2007 | Chen | H01L 21/76224 |
| | | | 438/435 |
| 8,399,363 B1 | 3/2013 | Lee | |
| 8,975,152 B2 | 3/2015 | Hong | |
| 2002/0106881 A1 * | 8/2002 | Jain | H01L 21/76844 |
| | | | 438/600 |
| 2004/0032006 A1 | 2/2004 | Yun | |
| 2006/0046425 A1 | 3/2006 | Sandhu | |
| 2006/0151855 A1 | 7/2006 | Kiyotoshi | |
| 2006/0175718 A1 | 8/2006 | Nitta | |
| 2006/0223279 A1 | 10/2006 | Patraw | |
| 2007/0032039 A1 * | 2/2007 | Chen | H01L 21/76224 |
| | | | 438/435 |
| 2007/0210403 A1 | 9/2007 | Sandhu | |
| 2007/0298584 A1 | 12/2007 | Tokuichi | |
| 2008/0003775 A1 | 1/2008 | Yamada | |
| 2008/0081434 A1 * | 4/2008 | Nam | H01L 21/76224 |
| | | | 438/432 |
| 2008/0160718 A1 * | 7/2008 | Lee | H01L 21/76232 |
| | | | 438/425 |
| 2012/0202336 A1 * | 8/2012 | Park | H01L 21/76229 |
| | | | 438/435 |
| 2012/0208346 A1 * | 8/2012 | Kadoshima | H01L 21/76229 |
| | | | 438/425 |
| 2012/0276713 A1 | 11/2012 | Miyahara | |
| 2014/0273530 A1 | 9/2014 | Nguyen et al. | |
| 2015/0060970 A1 | 3/2015 | Sasaki | |
| 2015/0270337 A1 | 9/2015 | Ujihara | |
| 2017/0018552 A1 | 1/2017 | Moon | |
| 2018/0366323 A1 | 12/2018 | Huang | |

* cited by examiner

SEMICONDUCTOR DEVICE AND METHOD FOR FABRICATING THE SAME

CROSS REFERENCE TO RELATED APPLICATIONS

This application is a division of U.S. application Ser. No. 16/048,335 filed Jul. 29, 2018, and incorporated herein by reference in its entirety.

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: providing a substrate having a memory region and a periphery region; forming a first trench and a second trench in substrate on the memory region, wherein a width of the second trench is greater than a width of the first trench; forming a first liner, a second liner, and a third liner in the first trench and the second trench; performing a surface treatment process to lower stress of the third liner; and planarizing the third liner, the second liner, and the first liner to form a first isolation structure and a second isolation structure.

According to another aspect of the present invention, a semiconductor device includes: a substrate having a memory region and a periphery region, a first isolation structure in the substrate on the memory region, and a second isolation structure adjacent to the first isolation structure, in which a width of the second isolation structure is greater than a width of the first isolation structure. Preferably the first isolation includes a first liner in the substrate, a second liner on the first liner, and a third liner on the second liner, in which a top surface of the third liner is planar. The second isolation structure on the other hand includes the first liner in the substrate, the second liner on the second liner, and the third liner on the second liner, in which a top surface of the third liner comprises a V-shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
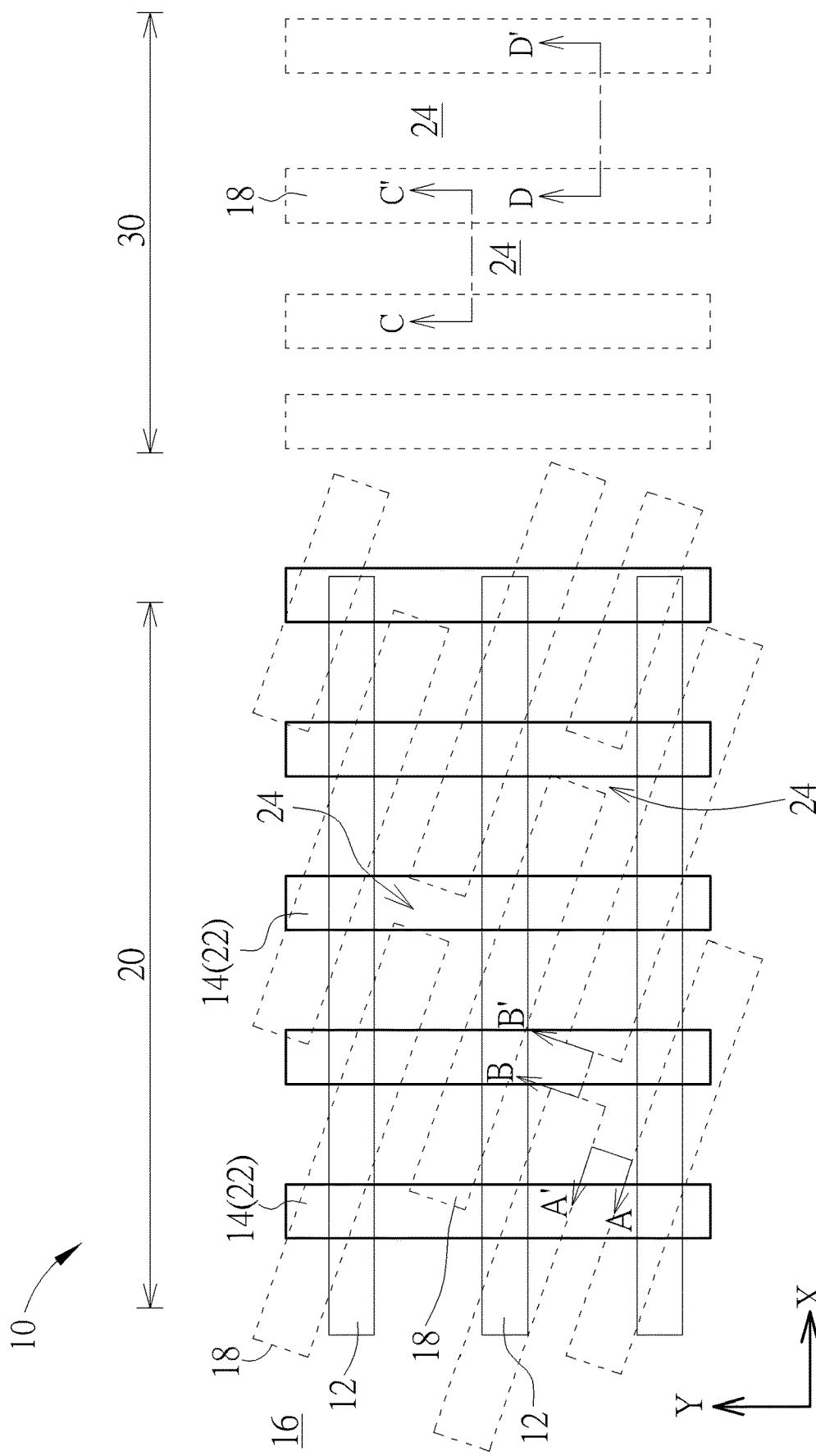
FIG. 1 illustrates a top-view of a DRAM device according to an embodiment of the present invention.
Figure 2:
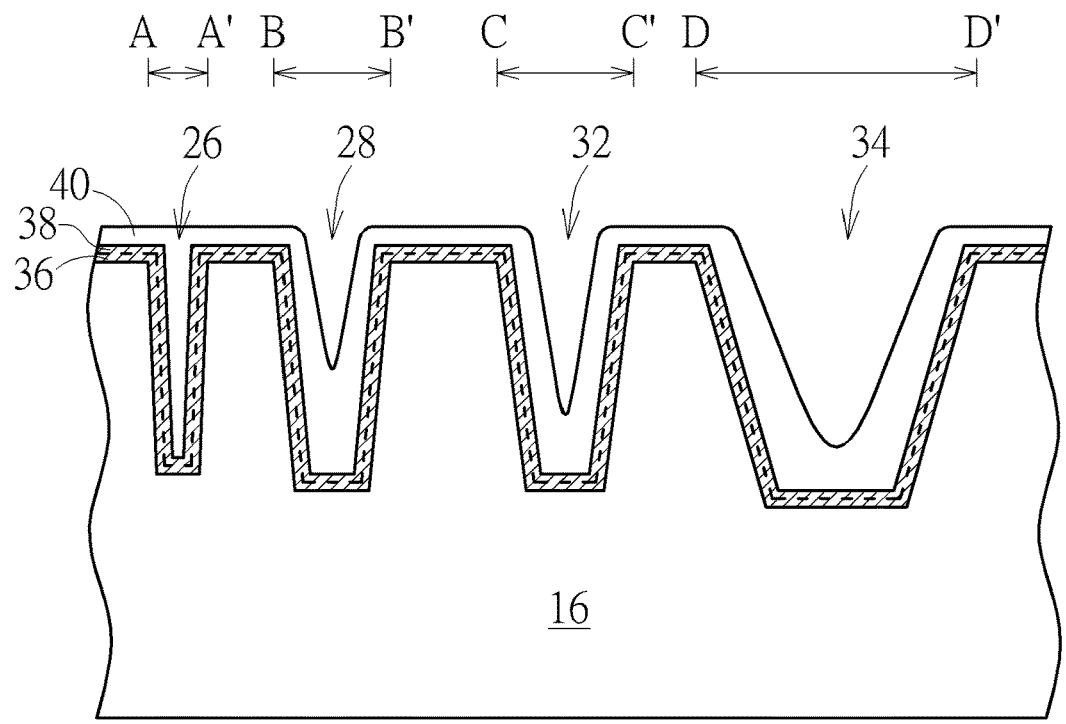
FIGS. 2-4 illustrate cross-sectional views for fabricating the DRAM device along the sectional line AA', the sectional line BB', the sectional line CC', and the sectional line DD' of FIG. 1.
Figure 3:
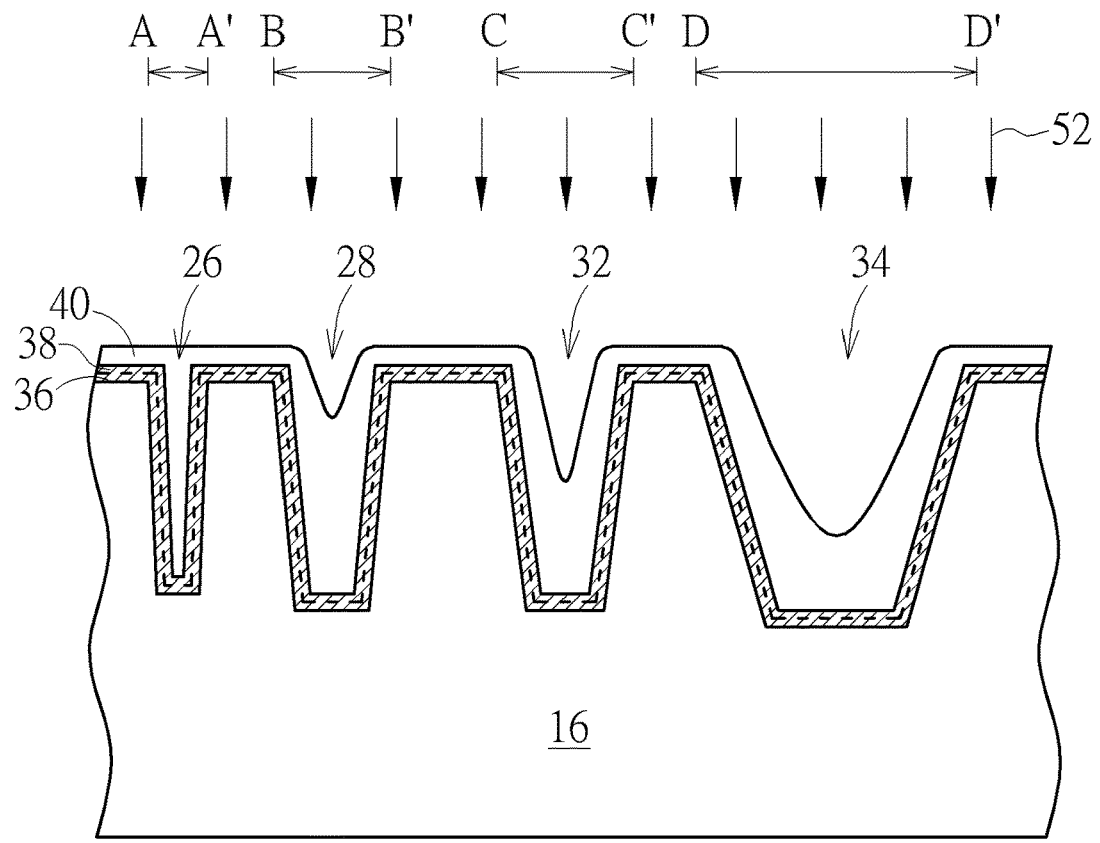
Figure 4:
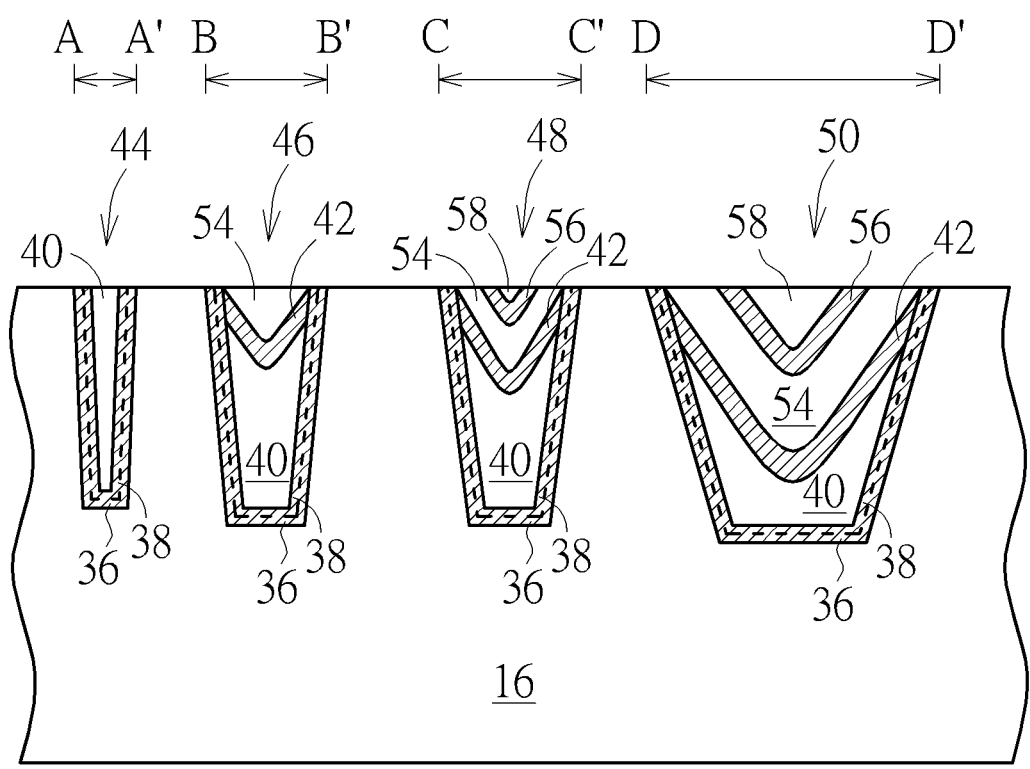

Referring to FIGS. 1-4, FIGS. 1-4 illustrate a method for fabricating a DRAM device according to an embodiment of the present invention, in which FIG. 1 illustrates a top-view of a DRAM device according to an embodiment of the present invention and FIGS. 2-4 illustrate cross-sectional views for fabricating the DRAM device along the sectional line AA', the sectional line BB', the sectional line CC', and the sectional line DD' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region 30 are also defined on the substrate 16, in which multiple word lines 14 and multiple bit lines 12 are preferably formed on the memory region 20 while other active devices (not shown) could be formed on the periphery region 30.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

The fabrication of STI or isolation structures before the formation of word lines 14 (or also referred to as buried word lines) is explained below. As shown in FIG. 2, a first trench 26 and a second trench 28 are formed in the substrate 16 on the memory region 20 and a third trench 32 and a fourth trench 34 are formed in the substrate 16 on the periphery region 30, in which a cross-section view of the first trench 26 is taken along the sectional line AA' shown in FIG. 1 or more specifically measured by the distance between longer axes of two adjacent active regions 18, a cross-section of the second trench 28 in the memory region 20 is taken along the sectional line BB' shown in FIG. 1 or more specifically measured by the distance between ends of two adjacent active regions 18, a cross-section of the third trench 32 in the periphery region 30 is taken along the sectional line CC' shown in FIG. 1, and a cross-section view of the fourth trench 34 in the periphery region 30 is taken along the sectional line DD' shown in FIG. 1. Each of the third trench 32 and the fourth trench 34 is measured by a distance between two adjacent active regions 18 in the periphery region 30.

In this embodiment, the first trench 26 being measured the distance between longer axes of two adjacent active regions 18 is also referred to as the body to body (B2B) trench, and the second trench 28 being measured the distance between two ends or tips of two adjacent active regions 18 is also referred to as the tip to tip (T2T) trench. Preferably, the width of the second trench 28 is greater than the width of the first trench 26, the width of the third trench 32 is greater than the width of the second trench 28, and the width of the fourth trench 34 is greater than the width of the third trench 32.

Next, a first liner 36 and a second liner 38 are sequentially formed on the surface of the substrate 16 and into the first trench 26, the second trench 28, the third trench 32, and the fourth trench 34 but not filling each of the trenches 26, 28, 32, 34 completely. Preferably, the first liner 36 is formed by an in-situ steam generation (ISSG) process, the second liner 38 is formed by an atomic layer deposition (ALD) process, and both the first liner 36 and the second liner 38 are preferably made of same material such as silicon oxide. Next, another ALD process is conducted to form a third liner 40 on the surface of the second liner 38, in which the third liner 40 preferably fills the first trench 26 completely but not filling the second trench 28, the third trench 32, and the fourth trench 34. Preferably, the second liner 38 and the third liner 40 are made of different materials. For instance, the second liner 38 is made of silicon oxide while the third liner 40 is made of silicon nitride, but not limited thereto.

Next, as shown in FIG. 3, a surface treatment process or more specifically a plasma treatment process 52 is conducted to lower the stress of the third liner 40 and at the same time repair surface profile of the third liner 40 while the third liner 40 completely fills the first trench 26 but only filling part of the second trench 28, part of the third trench 32, and part of the fourth trench 34. In this embodiment, the gas injected during the plasma treatment process 52 preferably includes argon (Ar), but could also include other inert gases depending on the demand of the process. For instance, according to an embodiment of the present invention the plasma treatment process 52 could also include a gas selected from the group consisting of nitrogen (N), helium (He), neon (Ne), argon (Ar), krypton (Kr), and xenon (Xe). Moreover, the power of the plasma treatment process 52 is preferably between 100 W to 300 W and the flow rate of the gas of the plasma treatment process 52 is between 2000 sccm to 3000 sccm. According to a preferred embodiment of the present invention, the stress value of the third liner 40 before conducting the plasma treatment process 52 shown in FIG. 2 is approximately 1.3 GPa and after the third liner 40 is treated by the surface treatment process or plasma treatment process 52 the stress of the third liner 40 could be lowered to approximately 0.8 GPa.

Viewing from a structural point of view, the depth of the V-shaped recess directly on top of the third liner 40 in the second trench 28 could be slightly reduced or the valley point (or bottommost point) of the V-shaped top surface of the third liner 40 could be moved slightly upward toward the surface of the substrate 16 when the third liner 40 is repaired by the plasma treatment process 52 as shown in FIGS. 2-3 so that other liners could be filled into the second trench 28 more easily afterwards. It should also be noted that the depths of the V-shaped recesses directly on top of the third liner 40 within the third trench 32 and the fourth trench 34 could also be slightly reduced in the similar manner during and/or after the plasma treatment process 52, which is also within the scope of the present invention.

Next, as shown in FIG. 4, an optional etching process could be conducted to remove part of the third liner 40 and then repeat the steps for forming the first liner 36, the second liner 38, and the third liner 40 to fill the second trench 28, the third trench 32, and the fourth trench 34. For instance, it would be desirable to sequentially form a fourth liner 42, a fifth liner 54, and a sixth liner 56 on the third liner 40 and then form an insulating layer 58 on the sixth liner 56. Since the first trench 26 has already been filled completely by the third liner 40, the fourth liner 42 would not be disposed in the first trench 26 but rather on the third liner 40 within the second trench 28, the third trench 32, and the fourth trench 34, the fifth liner 54 would preferably be formed on the fourth liner 42 in the second trench 28, the third trench 32, and the fourth trench 34 and fill the second trench 28 completely, the sixth liner 56 would be formed on the fifth liner 54 in the third trench 32 and the fourth trench 34, and the insulating layer 58 would be formed on the sixth liner 56 in the third trench 32 and the fourth trench 34 and fill the third trench 32 and fourth trench 34 completely.

It should be noted that since part of the third liner 40 has been removed by etching process before the fourth liner 42 is formed, the remaining third liner 40 is preferably embedded or enclosed entirely in the second trench 28, the third trench 32, and the fourth trench 34. In other words, the top surface of the third liner 40 in the first trench 26 is even with the top surface of the substrate 16 while the top surface of the third liner 40 in the second trench 28, the third trench 32, and the fourth trench 34 is preferably lower than the top surface of each of the trenches 28, 32, 34 or the top surface of the substrate 16.

In this embodiment, the third liner 40 and the fourth liner 42 are preferably made of different materials, the third liner 40 and the fifth liner 54 are preferably made of same material, and the third liner 40, the sixth liner 56, and the insulating layer 58 are preferably made of different materials, in which the third liner 40 preferably includes silicon nitride, the fourth liner 42 preferably includes silicon oxide, the fifth liner 54 preferably includes silicon nitride, the sixth liner 56 preferably includes silicon oxide, and the insulating layer 58 preferably includes spin-on-glass (SOG) or oxides such as silicon oxide having hydrogen bonds.

Next, a planarizing process such as chemical mechanical polishing (CMP) process and/or etching process is conducted to remove part of the insulating layer 58, part of the sixth liner 56, part of the fifth liner 54, part of the fourth liner 42, part of the third liner 40, part of the second liner 38, and part of the first liner 36 to form a first isolation structure 44 and second isolation structure 46 on the memory region 20 and a third isolation structure 48 and fourth isolation structure 50 on the periphery region 30.

Preferably, the first isolation structure 44, the second isolation structure 46, the third isolation structure 48, and the fourth isolation structure 50 are also represented by the STI 24 shown in FIG. 1, and the top surface of each of the isolation structures could be even with the top surface of the substrate 16 or slightly lower than the top surface of the substrate 16, which are all within the scope of the present invention. Next, it would be desirable to form buried word lines on the memory region 20 and form gate structures on the periphery region 30 depending on the demand of the process. This completes the fabrication of a semiconductor device according to an embodiment of the present invention.

Referring again to FIG. 4, FIG. 4 further illustrates a structural view of a semiconductor device according to an embodiment of the present invention. As shown in FIG. 4, the semiconductor device preferably includes a first isolation structure 44 and a second isolation structure 46 disposed in the substrate 16 on the memory region 20 and a third isolation structure 48 and a fourth isolation structure 50 disposed in the substrate 16 on the periphery region 30. In this embodiment, the width of the second isolation structure 46 or more specifically the width of the topmost surface of the second isolation structure 46 is greater than the width of the first isolation structure 44 or more specifically the width of the topmost surface of the first isolation structure 44. Moreover, the width (or most specifically the width of the topmost surface) of the third isolation structure 48 is greater than the width (or more specifically the width of the topmost surface) of the second isolation structure 46, and the width (or more specifically the width of the topmost surface) of the fourth isolation structure 50 is greater than the width (or more specifically the width of the topmost surface) of the third isolation structure 48.

Viewing form a more detailed perspective, the first isolation structure 44 includes a first liner 36 disposed in the substrate 16, a second liner 38 disposed on the first liner 36, and a third liner 40 disposed on the second liner 38, in which both the first liner 36 and the second liner 38 are U-shaped, the top surface of the first liner 36, second liner 38, and third liner 40 is even with or slightly lower than the top surface of the substrate 16, and the top surface of the three liners 36, 38, 40 is planar.

In contrast to the first isolation structure 44 only includes three liners, the second isolation structure 46 includes a first liner 36 disposed in the substrate 16, a second liner 38 disposed on the first liner 36, a third liner 40 disposed on the second liner 38, a fourth liner 42 disposed on the third liner 40, and a fifth liner 54 disposed on the fourth liner 42, in which the top surface of the third liner 40 includes a V-shape, the third liner 40 is embedded in the substrate 16 completely, and the top surface of the fifth liner 54 is planar and even with the top surface of the substrate 16.

Each of the third isolation structure 48 and the fourth isolation structure 50 includes a first liner 36 disposed in the substrate 16, a second liner 38 disposed on the first liner 36, a third liner 40 disposed on the second liner 38, a fourth liner 42 disposed on the third liner 40, a fifth liner 54 disposed on the fourth liner 42, a sixth liner 56 disposed on the fifth liner 54, and an insulating layer 58 disposed on the sixth liner 56. Similar to the second isolation structure 46, the top surface of the third liner 40 within the third isolation structure 48 and the fourth isolation structure 50 includes a V-shape or V-shaped profile as the third liner 40 is completely embedded within the substrate 16 between the second liner 38 and the fourth liner 42 and not exposed outside the second trench 28, the third trench 32, and the fourth trench 34. Specifically, the two tips and one valley point of the V-shaped profile are all lower than the top surface of the substrate 16.

In this embodiment, the first liner 36 and the second liner 38 are preferably made of same material such as silicon oxide, the second liner 38 and the third liner 40 are preferably made of different materials, and the third liner 40 and the fifth liner 54 are preferably made of same material while the third liner 40 and the fourth liner 42 are made of different materials and the third liner 40 and the sixth liner 56 are also made of different materials. For instance, the third liner 40 preferably includes silicon nitride, the fourth liner 42 preferably includes silicon oxide, the fifth liner 54 preferably includes silicon nitride, the sixth liner 56 preferably includes silicon oxide, and the insulating layer 58 preferably includes SOG or oxides containing hydrogen bond.

In current DRAM process, four trenches having different widths as disclosed in the aforementioned embodiment are first formed in the substrate on the memory region and the periphery region respectively, and an ISSG process and an ALD process are conducted in sequence to form a first liner and a second liner both made of silicon oxide and a third liner made of silicon nitride in the four trenches. Since this approach easily creates voids between liners deposited in the trenches, the present invention preferably conducts a plasma treatment process after the third liner is formed to lower the stress of the third liner while repairing the surface profile of the third liner so that voids could be minimized. Viewing from a structural perspective, the depths of the V-shaped recesses (shown in FIGS. 2-3) directly above the third liner in the trenches 28, 32, 34 could be slightly reduced as the surface of the third liner is repaired by the plasma treatment process so that other liners could be deposited more easily into the trenches on top of the third liner afterwards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a memory region and a periphery region;
   forming a first trench and a second trench in substrate on the memory region, wherein a width of the second trench is greater than a width of the first trench;
   forming a first liner, a second liner, and a third liner in the first trench and the second trench;
   performing a surface treatment process to lower stress of the third liner; and
   planarizing the third liner, the second liner, and the first liner to form a first isolation structure and a second isolation structure.

2. The method of claim 1, further comprising:
   forming the first trench and the second trench on the memory region and a third trench in the substrate on the periphery region, wherein a width of the third trench is greater than a width of the second trench;
   forming the first liner, the second liner, and the third liner in the first trench, the second trench, and the third trench; and
   planarizing the third liner, the second liner, and the first liner to form the first isolation structure, the second isolation structure, and a third isolation structure.

3. The method of claim 2, further comprising;
forming a fourth liner on the third liner in the second trench and the third trench;
forming a fifth liner on the fourth liner in the second trench and the third trench;
forming a sixth liner on the fifth liner in the third trench; and
planarizing the sixth liner, the fifth liner, the fourth liner, the third liner, the second liner, and the first liner to form the first isolation structure, the second isolation structure, and the third isolation structure.

4. The method of claim 3, wherein the third liner and the fourth liner comprise different materials.

5. The method of claim 3, wherein the third liner comprises silicon nitride and the fourth liner comprises silicon oxide.

6. The method of claim 3, wherein the third liner and the fifth liner comprise a same material.

7. The method of claim 6, wherein the third liner and the fifth liner comprise silicon nitride.

8. The method of claim 1, further comprising performing an in-situ steam generation (ISSG) process to form the first liner.

9. The method of claim 1, further comprising performing an atomic layer deposition (ALD) process to form the second liner.

10. The method of claim 1, wherein the first liner and the second liner comprise silicon oxide.

11. The method of claim 1, wherein the surface treatment process comprises a plasma treatment process.

\* \* \* \* \*